United States Patent [19]

Tseng

[11] Patent Number: 5,656,532
[45] Date of Patent: Aug. 12, 1997

[54] METHOD FOR FABRICATING A COAXIAL CAPACITOR OF A SEMICONDUCTOR DEVICE

[75] Inventor: Horng-Huei Tseng, Hsinchu, Taiwan

[73] Assignee: Vanguard International Semiconductor Corporation, Hsin-Chu, Taiwan

[21] Appl. No.: 585,032

[22] Filed: Jan. 11, 1996

[51] Int. Cl.$^6$ ............................................. H01L 21/8242
[52] U.S. Cl. ............................................. 438/253; 438/396
[58] Field of Search ............................. 437/47, 60, 191, 437/193, 195, 919; 148/DIG. 14

[56] References Cited

U.S. PATENT DOCUMENTS

| | | | |
|---|---|---|---|
| 5,084,405 | 1/1992 | Fazan et al. | 437/919 |
| 5,185,282 | 2/1993 | Lee et al. | 437/47 |
| 5,399,518 | 3/1995 | Sim et al. | 437/52 |
| 5,403,767 | 4/1995 | Kim | 437/52 |
| 5,443,993 | 8/1995 | Park et al. | 437/60 |
| 5,516,719 | 5/1996 | Ryou | 437/919 |

*Primary Examiner*—Chandra Chaudhari
*Attorney, Agent, or Firm*—George O. Saile; William J. Stoffel

[57] ABSTRACT

A method for fabricating a coaxial capacitor with increased capacitance which improves the process tolerances was accomplished. Fabricating this improved coaxial capacitor involves forming an annular groove in a polysilicon layer over the node contact opening. Next, sidewall spacers are formed on the sidewalls of the annular groove. A polyoxide masking layer is formed covering the first conductive layer. The sidewall spacers are removed exposing portions of the first conductive layer. The exposed portions of the first conductive layer are then etched using the masking layer as a mask forming a channel surrounding a central spine. The masking layer is removed. The first conductive layer is masking and etched completing the patterning of the ridge and thereby forming a storage electrode having an annual ridge about the central spine. This use of sidewall spacers to define the capacitor ridges allows smaller ridge definition than capable using photolithographic processes and is more controllable. The coaxial capacitor is then completed by depositing a capacitor dielectric and a top capacitor electrode over the storage electrode.

30 Claims, 11 Drawing Sheets

METHOD FOR FABRICATING A COAXIAL CAPACITOR OF A SEMICONDUCTOR DEVICE

BACKGROUND OF THE INVENTION

1) Field of the Invention

The present invention relates generally to the fabrication of capacitors in a semiconductor memory device and more particularly to a method for fabricating a highly integrated semiconductor memory having a coaxial storage electrode for high reliability and large cell capacitance for memory cells.

2) Description of the Prior Art

The development of the semiconductor industry has always followed that of the Dynamic Random Access Memory (DRAM) technology in that the DRAM development has led in the use of the highest density technology elements capable of being produced in manufacturable quantities. The development of DRAM's in the 4 Megabit density range began to depart from the twenty year tradition of two-dimensional DRAM designs by the appearance of three-dimensional DRAM cell structures, most notable by the use of trench capacitors. Proposed designs for DRAM cells in 16 MB, 64 MB and high density range have also included the use of multi-plate or stacked storage capacitor cell designs. Although the use of stacked cell technology has rendered the processing of DRAMs more complex, such techniques continue to be used extensively.

The decrease in cell capacitance caused by reduced memory cell area is a serious obstacle to increasing packing density in dynamic random access memories (DRAMs). The problem of decreased cell capacitance must be solved to achieve higher packing density in semiconductor memory devices, since decreased cell capacitance degrades read-out capability and increases the soft error rate of memory cells as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitor include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suited for an integrated memory cell which is 64 Mb or higher. Also, an improve stacked capacitor has recently been presented, where pillars or another inner cylinder is formed in the interior of the cylinder. Not only may both of the inner and outer surfaces of the cylinder be utilized as the effective capacitor area, but also the outer surface of the pillars or the inner cylinder formed in the interior of the cylinder. However, even more surface area and capacitance are required to achieve higher densities.

The following U.S. patents show related processes and capacitor structures: U.S. Pat. Nos. 5,399,518, Sim et at.; 5,403,767, Kim; 5,443,993, Park et at.; and 5,185,282, Lee et at. However, many of these methods require substantially more processing steps or/and planar structures which make the manufacturing process more complex and costly. Therefore, it is very desirable to develop processes that are as simple as possible.

There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields. There is also a challenge to develop a coaxial capacitor which is easy to manufacture.

SUMMARY OF THE INVENTION

It is an object of the present invention to provide a method for fabricating a coaxial capacitor of a semiconductor memory device, which ensures high reliability and large cell capacitance of the memory device.

It is another object of the present invention to provide a novel method for fabricating a coaxial capacitor which increases yields by increasing the process tolerances, ensures high reliability, and increases the capacitance of the capacitor.

It is another object of the present invention to provide a method for fabricating a coaxial capacitor of a semiconductor memory device, which is easy to manufacture, inexpensive to manufacture and uses a minimum number of masking operations.

To accomplish the above objectives, the present invention provides a method of manufacturing a coaxial capacitor for a DRAM. An insulation layer is formed over the substrate surface in an active area including a field effect transistor. A contact opening is formed through the insulation layer. Then a polysilicon layer is formed filling the contact opening and covering the first insulation layer. Fabricating the improved coaxial capacitor involves forming an annular groove in the polysilicon layer centered over the contact opening. Next, sidewall spacers are formed on the sidewalls of the annular groove. A polyoxide masking layer is formed covering the first conductive layer, but not coveting the sidewall spacers. The sidewall spacers are removed exposing the underlying portions of the first conductive layer. Using the masking layer as a mask, the exposed portions of the first conductive layer are then etched forming a channel surrounding a central spine. The masking layer is then removed. The first conductive layer is masked and etched forming a storage electrode having an annual ridge about the central spine. This use of sidewall spacers to define the electrode ridges allows smaller ridge definition than possible using photolithographic processes and provides a more controllable process. The coaxial capacitor is then completed by depositing a high dielectric constant insulator layer and a top capacitor electrode over the storage electrode.

Briefly, the present invention provides a method of fabricating a high capacitance coaxial capacitor on a semiconductor substrate having a device area formed thereon comprising the steps of: forming a first insulation layer over the device area and elsewhere over the substrate surface; forming a contact opening in the first insulation layer to expose the device area surface; forming a first conductive layer on the first insulation layer and filling the contact opening; forming an annular groove in the first conductive layer centered over the first opening; the annular groove having sidewalls; forming sidewall spacers on the sidewalls of the annular groove; forming a masking layer covering the first conductive layer; removing the sidewall spacers exposing portions of the first conductive layer; etching the exposed portions of the first conductive layer using the masking layer as a mask forming a channel surrounding a central spine; removing the masking layer; masking and etching the first conductive layer forming a patterned area of the first conductive layer over and aligned to the device area thereby forming an annual ridge about the central spine; the central spine and the annular ridge comprising a storage electrode; forming a capacitor dielectric layer over the storage electrode; and forming a top plate electrode over the capacitor dielectric layer thereby forming the coaxial capacitor.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for forming a dynamic random access memory (DRAM) storage capacitor having a coaxial electrode is described in detail. The sequence of fabrication steps for a coaxial electrode is shown in FIGS. 1 through 14. The process for forming the field oxide and the field effect transistor structure as presently practiced in manufacturing DRAM cells is only briefly described in order to better understand the current invention. It should be well understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. The conductivity types of the elements can also be switched (e.g., from n to p type) as is commonly known in the art. Also, the capacitor can be used in other type chip in addition to DRAM cells.

Substrate 01 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer, and metallurgy lines.

Figure 1:
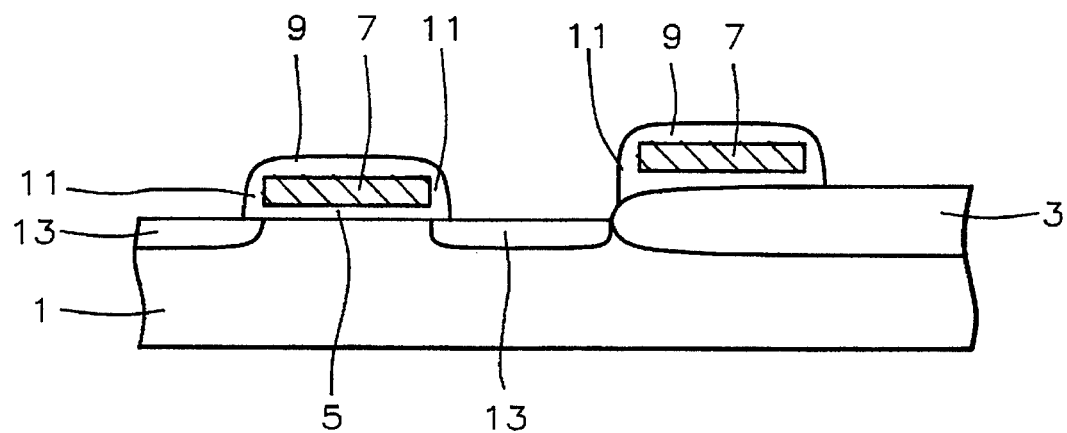
FIGS. 1 through 14 are cross sectional views for illustrating a first embodiment for a method for manufacturing the coaxial capacitor of a semiconductor memory device according to the present invention.

Referring now to FIG. 1, a cross-sectional view of the substrate 1 having a partially completed DRAM cell formed on the substrate surface, is schematically shown. A field oxide layer 03 is formed on a semiconductor substrate 1 for defining active regions and isolation regions. The preferred substrate is composed of a P-type single crystal silicon having a (100) crystallographic orientation. A relatively thick field oxide (FOX) 03 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness is in the range of about 3000 and 6000 Å.

The semiconductor device is then formed in the active device area after removing the silicon nitride barrier layer and the pad oxide in a conventional wet etch. The most commonly used device for dynamic random access memory is MOSFET. This device is formed by first thermally oxidizing the active device area to form a thin gate oxide 5. The preferred thickness is between about about 50 and 200 Å.

An appropriately doped polysilicon layer, and a cap insulating layer are deposited on substrate 10 and conventional photolithographic techniques are used to pattern them to form a gate oxide layer 05, a gate electrode 07 and a cap insulation layer 09.

This forms the transfer gate 5 7 9 of the MOSFET in the active device areas and on the field oxide regions. The gates on the field oxide regions preferably form the word lines that electrically connect the MOSFET gate electrode to the appropriate peripheral circuits on the DRAM chip. The lightly doped source/drains (shown as part of region 13) of the N-channel MOSFET are formed next, usually by implanting an N-type atomic species, such as arsenic or phosphorus, through the spaces between the gate electrodes 18 19 21 and filed oxide regions 03. For example, a typical implant might consist of phosphorus P31 at a dose of between about 1 and 10 E13 atoms/cm$^2$ and at an energy between about 30 and 80 Kev.

After forming the tightly doped source/drains, sidewall spacers 11 are formed on the transfer gate sidewalls. These sidewall spacers 11 can be formed by depositing a low temperature silicon oxide and anisotropically etching back to the silicon substrate surface. For example, the silicon oxide could be a chemical vapor deposition using tetraethoxysilane (TEOS) at a temperature in the range of about 650° to 900° C. and the etch back performed in a low pressure reactive ion etcher.

The source/drain regions 13 of the MOSFET are now implanted between the spacers 11 and the field oxide regions 3 with a N type atomic species, for example, arsenic (As75), to complete the source/drain (node contact) 14. The implantation is usually done through a thin layer of silicon oxide of about 200 and 300 Å in thickness to minimize implant channeling and to protect against contamination by metals and other impurities. A typical implantation dose is preferably between 2E15 and 1E16 atoms/cm$^2$ and an energy is preferably between about 20 and 70 Kev.

Figure 2:
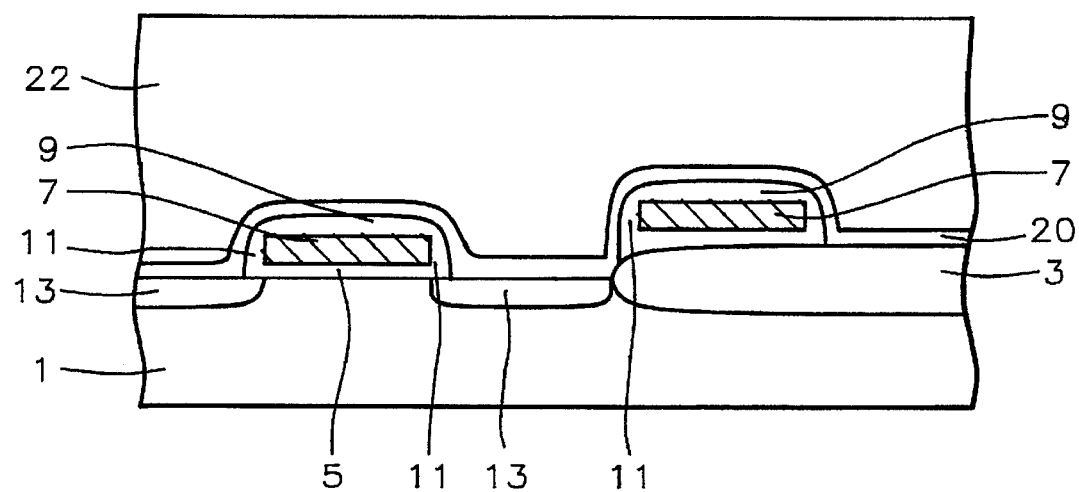

As shown in FIG. 2, a conformal dielectric layer 20 is formed over the substrate surface and contacts the source and drain areas 13 as shown in FIG. 1. The conformal insulating layer is preferably formed of silicon nitride or silicon oxide. The conformal dielectric layer 20 is preferably composed of silicon oxide formed by a low temperature TEOS process with a temperature the range between about 650° and 900° C. Layer 20 preferably has a thickness in the range between about 500 and 2000 Å and more preferably about 1000 Å.

A planarizing first insulation layer 22 is formed over the conformal dielectric layer 20. The first insulation layer 22 can be formed of silicon oxide, and borophosphosilicate glass. The first insulation layer can be formed of silicon oxide formed by a low temperature chemical vapor deposition using tetraethoxysilane (TEOS). The first insulation layer 22 is preferably formed of borophosphosilicate glass (BPSG). A borophosphosilicate glass layer can be formed by low pressure chemical vapor deposition (LPCVD) using tetraethylorthosilicate (TEOS) as a reactant. Boron and phosphorus are added to the ambient during the formation of the borophosphosilicate glass layer. The borophosphosilicate layer is thermally treated at a temperature of 850° C. for 30 minutes to cause flow and planarization. Alternately, layer 22 can be planarized using a chemically mechanically polish (CMP) method. The first insulating layer 22 preferably has a thickness in the range of about 5000 and 10,000 and more preferably a thickness of about 6000 Å.

Figure 3:
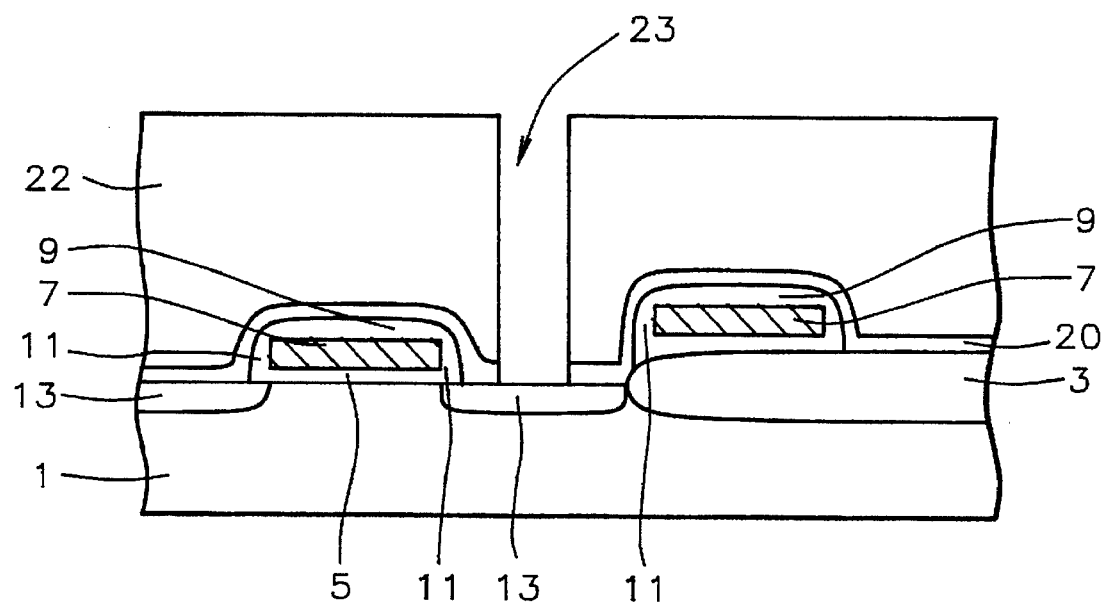

As shown in FIG. 3, an opening in the first insulation layer 22 is formed providing a contact opening 23 for the coaxial capacitor and exposes the device area surface. The contact opening 23 is formed by using conventional photolithographic techniques and etching in a low pressure plasma etcher having a high silicon oxide to silicon etch rate selectivity. For example, a gas mixture of carbon tetrafluoride and hydrogen ($CF_4/H_2$) can be used as the etching gas. The opening 23 preferably has a depth in the in the range between about 0.5 and 0.8 μm and a width in the range of between about 0.2 and 0.5 μm.

Figure 4:
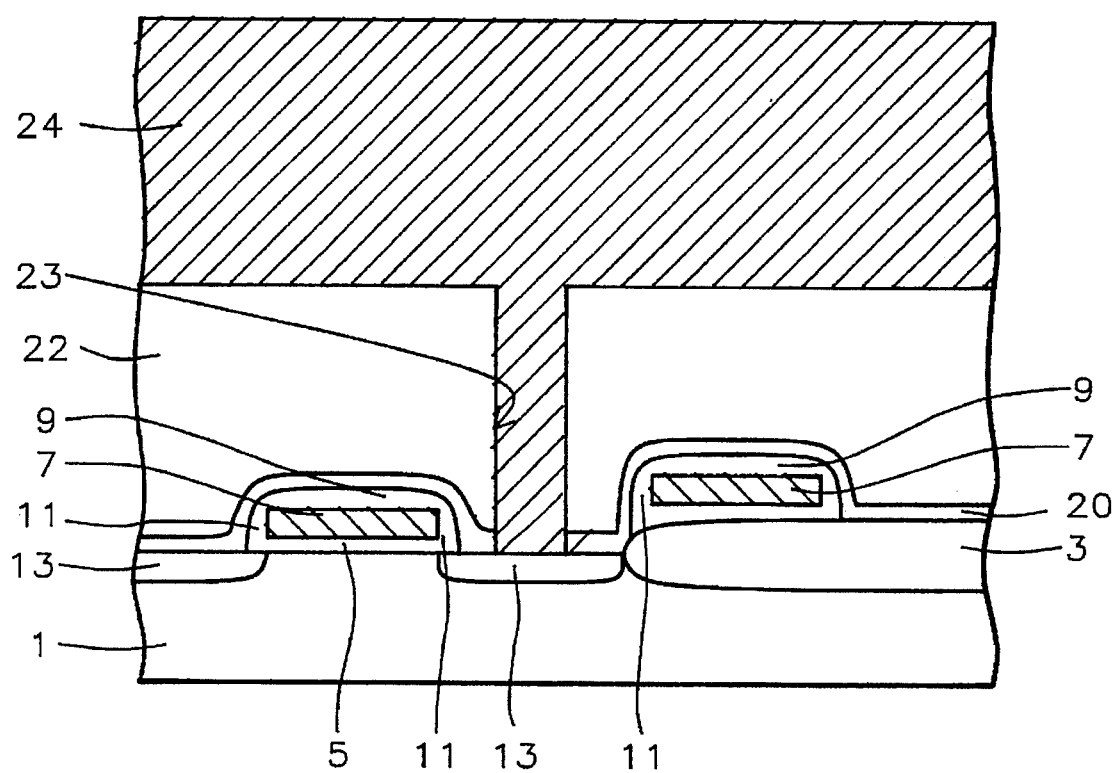

The remainder of this embodiment relates more specifically to those objects of the invention, which relate to the formation of the storage capacitor having increased capacitance and also providing a more manufacturable process. The new capacitor structure is formed having a coaxial storage electrode. As shown in FIG. 4, a first conductive layer 24 is then formed over the first insulation layer 30 and fills the contact opening 23. The first conductive layer 24 makes an electrical contact to the active area (e.g., 13). The first conductive layer 24 can be formed of and polysilicon material. The first conductive layer 24 is preferably composed of polysilicon formed using a LPCVD reactor at a process temperature of between about 550° and 650° C. The polysilicon layer 32 can be doped N-type by ion implantation using, for example, arsenic ions and having an implant dose of between about 1E15 and 2E16 atoms/cm$^2$ and an ion energy of between about 20 and 80 Kev. Alternatively, the polysilicon layer can be doped in situ during the polysilicon deposition. The first conductive layer 24 preferably has a thickness in the range between about 3000 and 8000 Å and more preferably a thickness of about 6000 Å. The first conductive layer can have an impurity concentration in the range of between about 1E20 and 1E22 atoms/cm$^3$ and more preferably about 1E21 atoms/cm$^3$.

Figure 5:
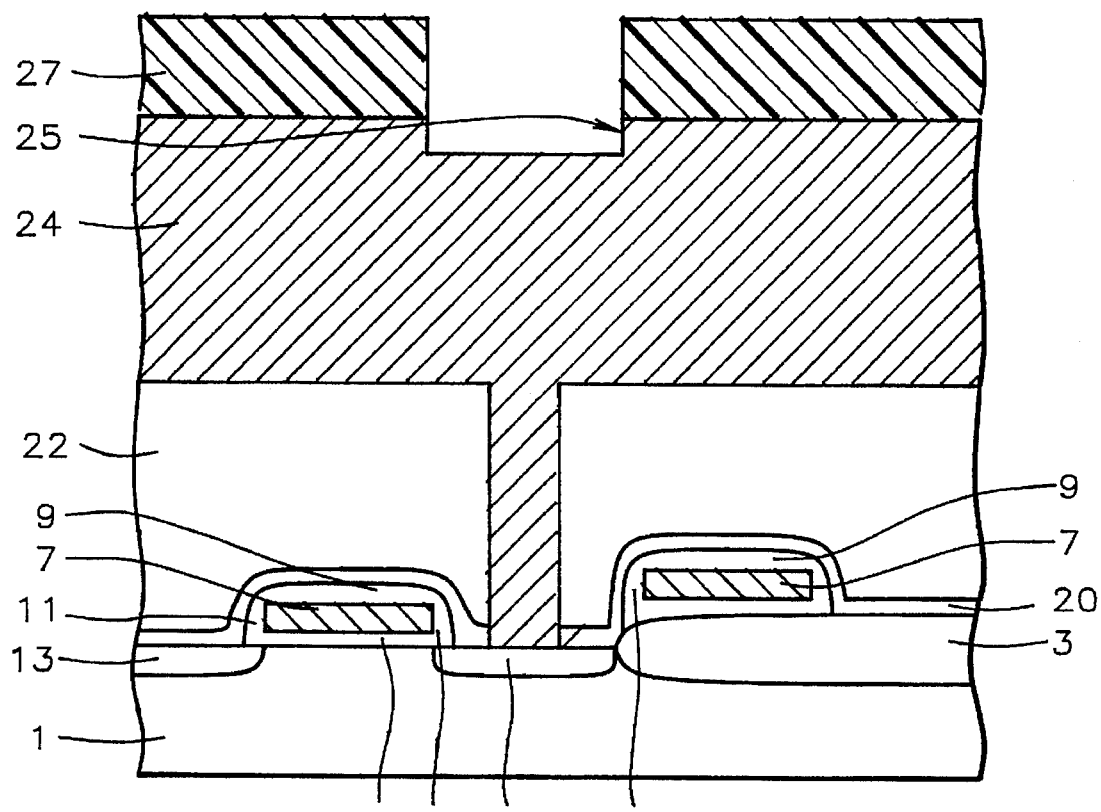
Figure 6:
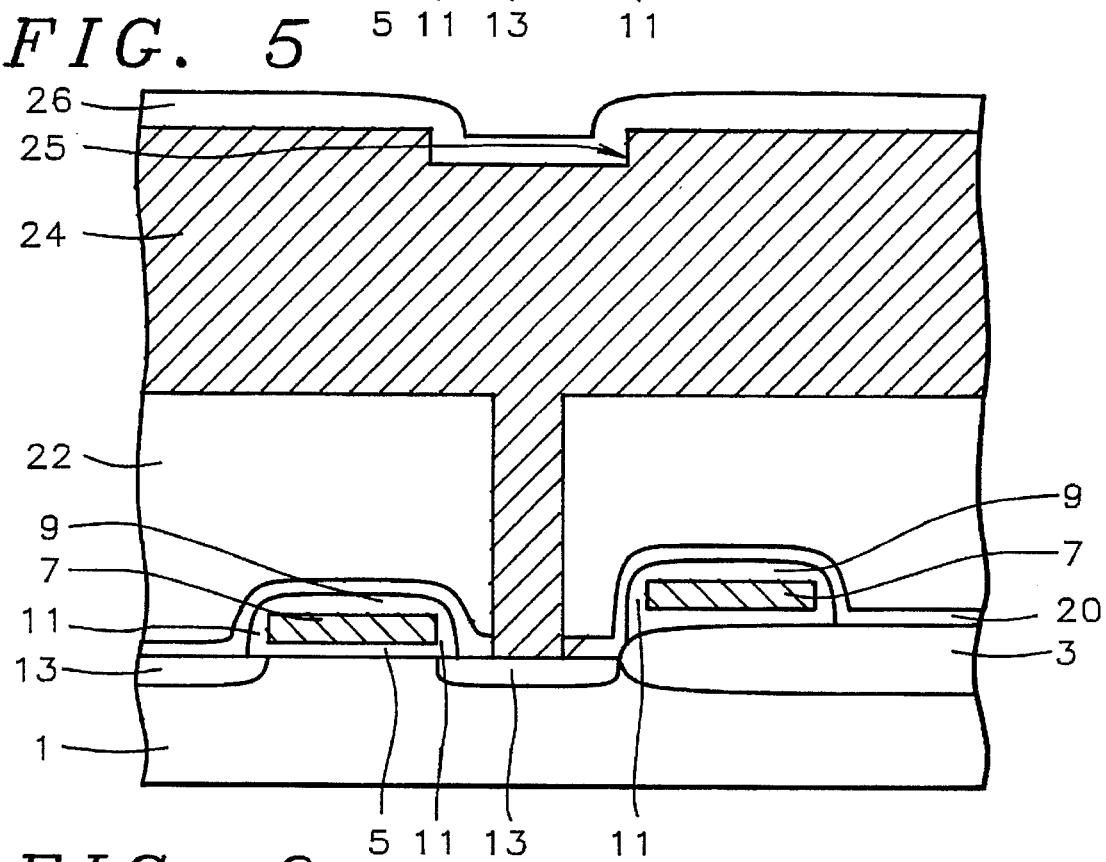

An annular groove 25 is next formed in the first polysilicon layer 24 by a masking and etching process. As shown in FIG. 5, a photoresist layer 27 having an opening over the active areas (e.g., drain area of the FET) is formed over the first insulation layer 24. Next, an annular groove 25 is formed in the first conductive polysilicon layer over the first opening. The annular groove 25 has a width in the range between about 0.4 and 1.2 μm and more preferably about 0.9 μm and depth in the range between about 0.1 and 0.2 μm and more preferably about 0.15 μm.

Figure 7:
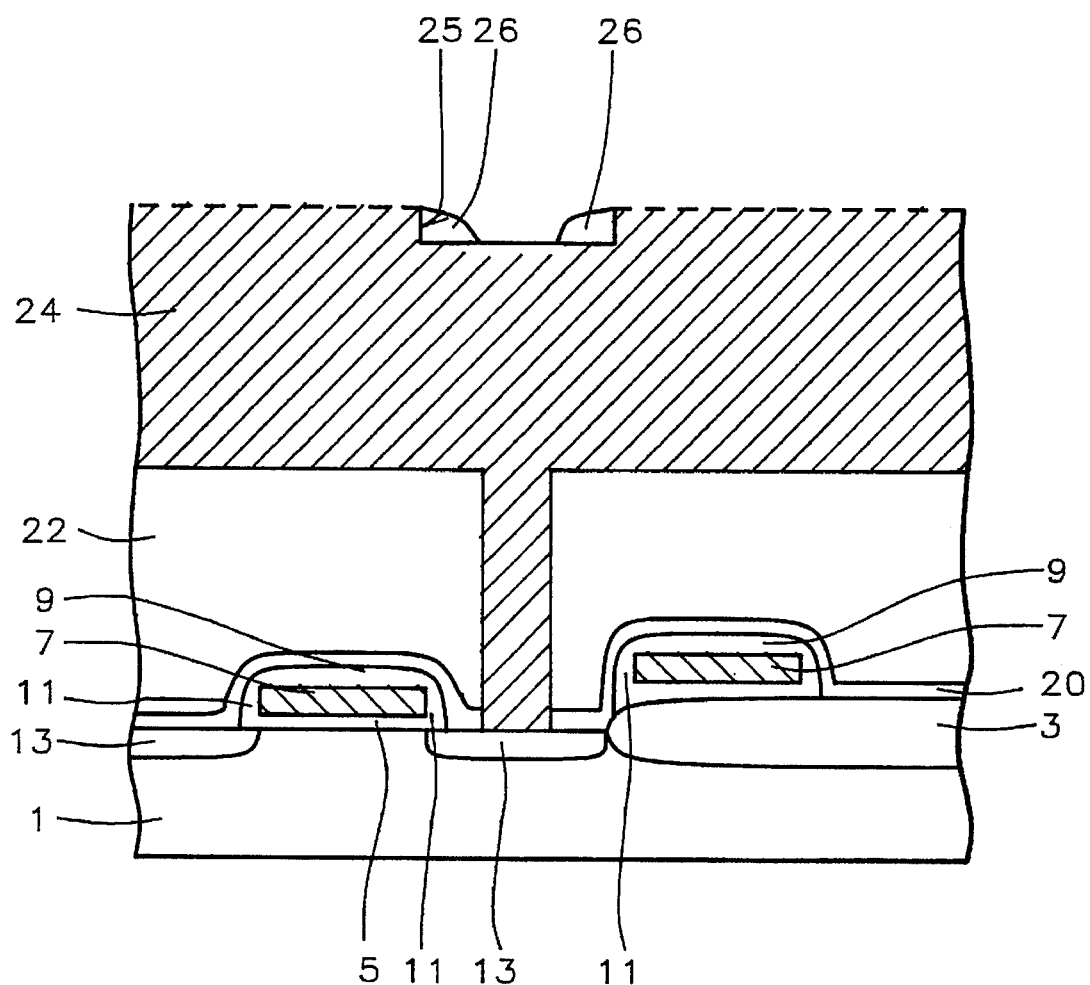

As shown in FIG. 7, sidewall spacers 26 are formed on the sidewall of the annular groove 25. The sidewall spacers 26 are formed by depositing an insulation layer over the first conductive layer and anisotropically etching the insulation layer and exposing the surface of the first conductive layer 24. The sidewall spacers 26 are preferably composed of silicon nitride. A silicon nitride layer can be formed by reacting silane and ammonia at atmospheric pressure at 700° and 900° C., or by reacting dichlorosilane and ammonia at reduced pressure at approximately 700° C. Also, silicon nitride can be formed by plasma enhance chemical vapor deposition by reacting silane with ammonia or nitrogen in a glow discharge between 200° and 350° C. The sidewall spacers can have a width in the range between about 1000 and 2000 Å and more preferably about 1500 Å.

Figure 8:
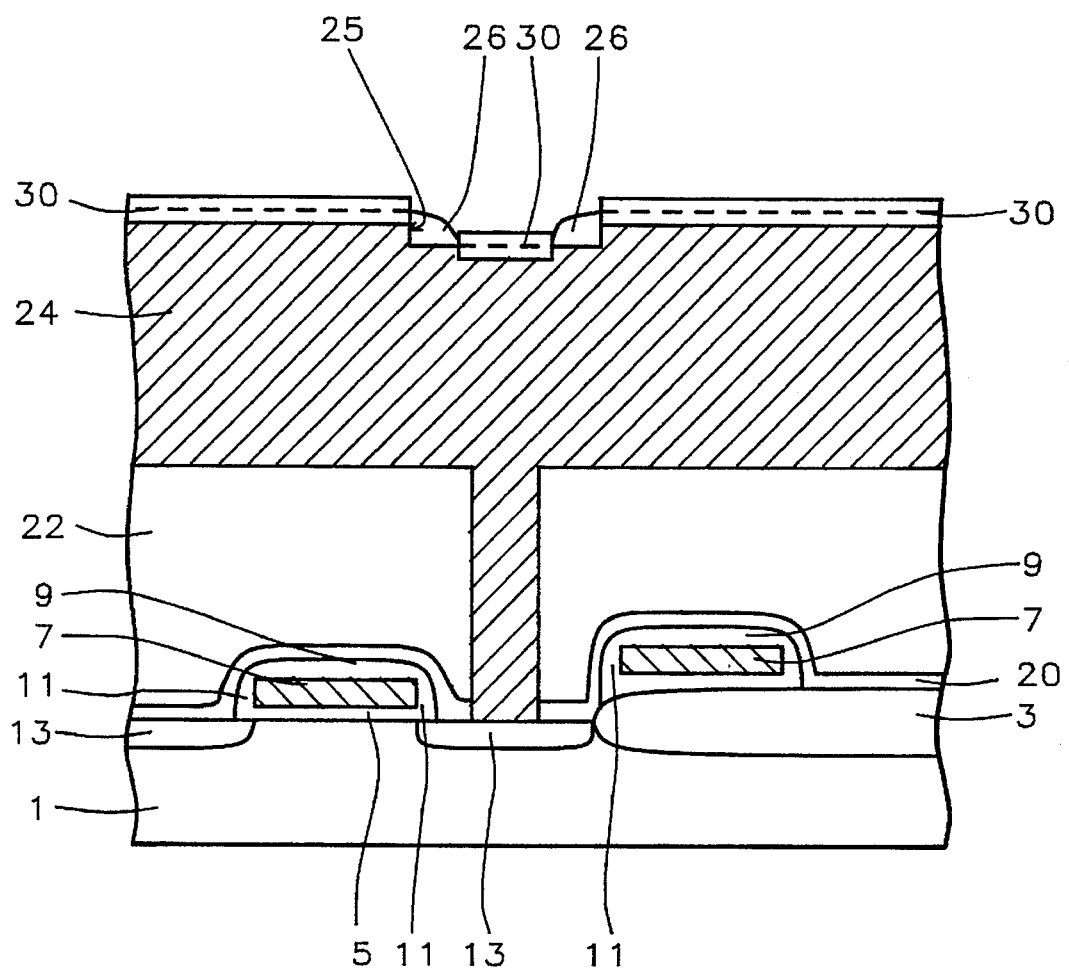

As displayed in FIG. 8, a masking layer 30 is formed covering the first conductive polysilicon layer. The masking layer can be formed by oxidizing the first conductive layer forming a polyoxide layer. The polyoxide layer preferably has a thickness in the range between about 300 and 1000 Å and more preferably about 500 Å. The use of a polyoxide masking layer as opposed to the use of a photoresist layer allows smaller features to be defined beyond the photolithographic limits. This allows the memory cell area to be reduced.

Figure 9:
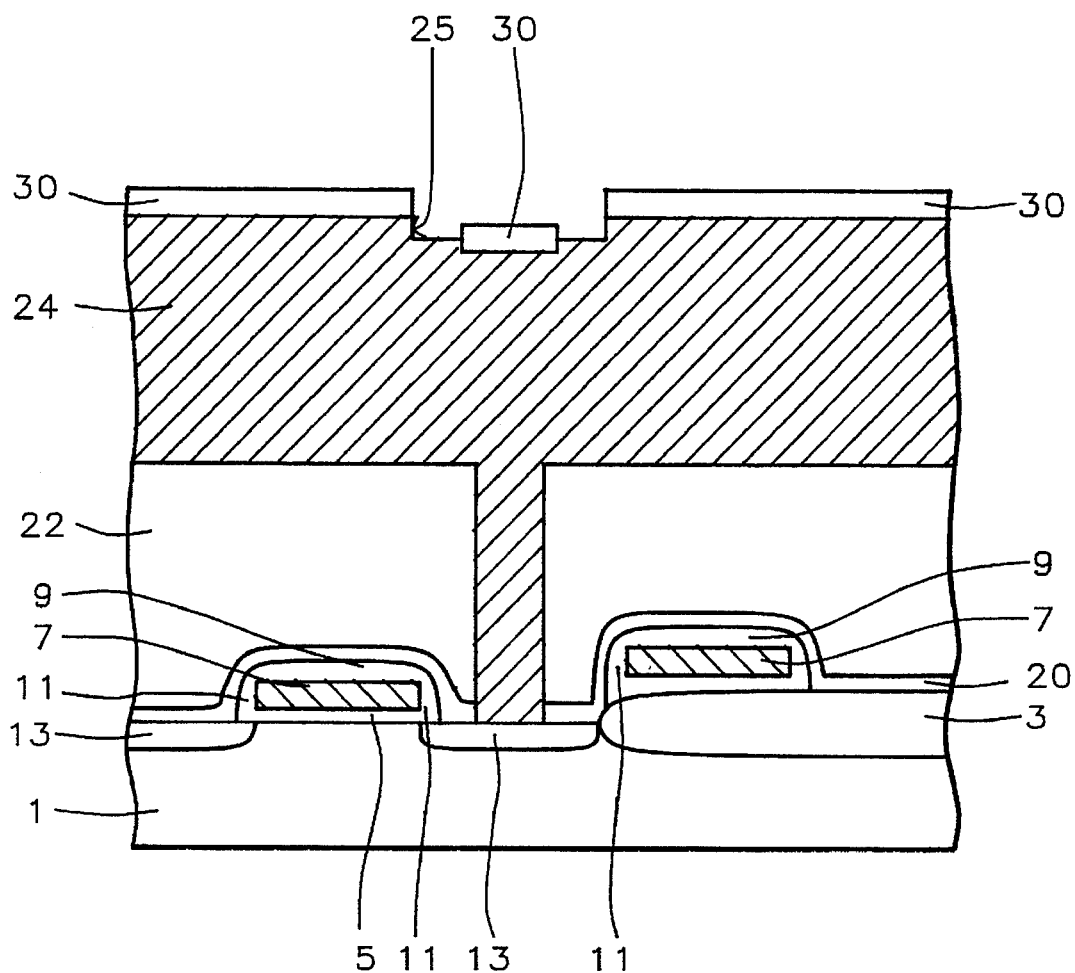

Referring to FIG. 9, the sidewall spacers 26 are removed thus exposing the underlying portions of the first conductive polysilicon layer 24.

Figure 10:
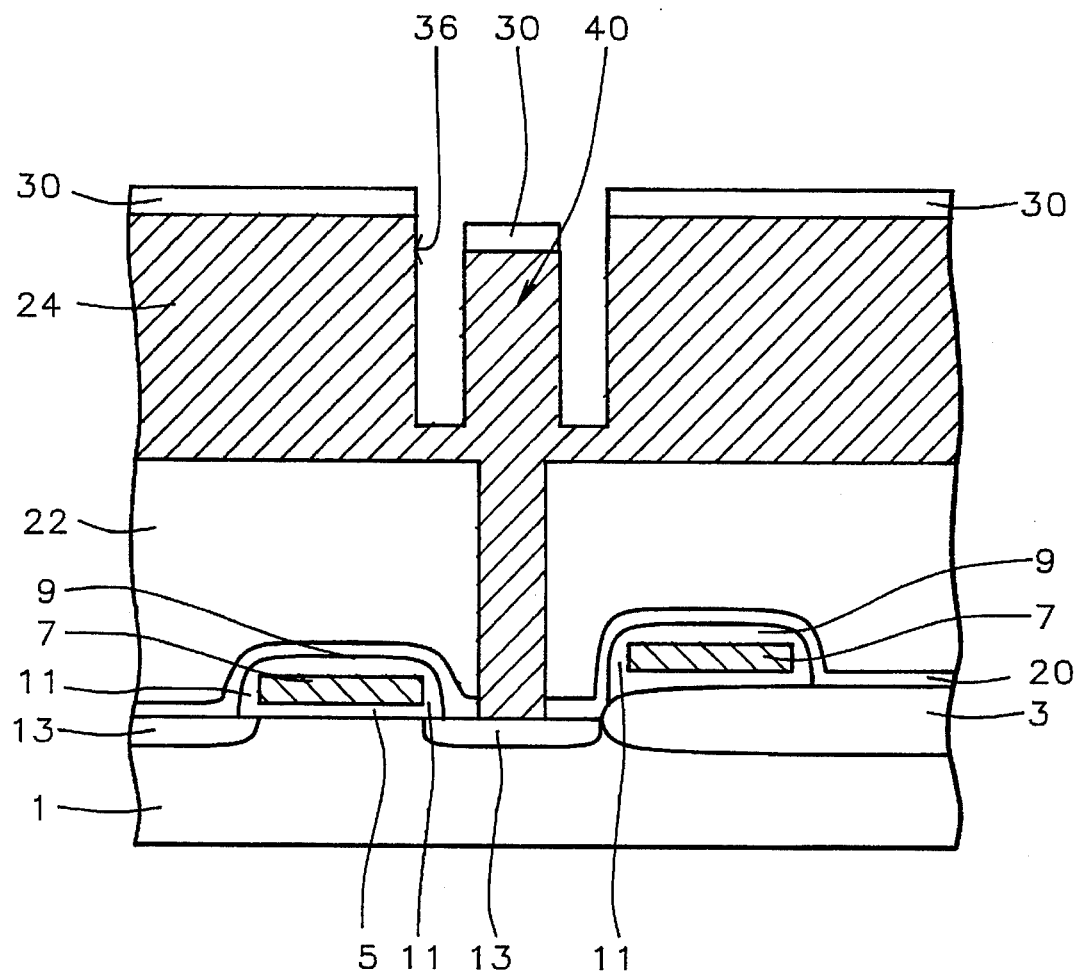

As shown in FIG. 10, the exposed portions of the first conductive polysilicon layer 24 are etched using the masking layer 30 as a mask forming a channel 36 surrounding a central spine 40 in the first conductive polysilicon layer 24. The etching of the exposed portions of the first conductive layer is performed with a plasma etch, preferably a HBr or $Cl_2$ etch.

The central spine 40 preferably has a diameter smaller than the lithography limits and preferably in the range between about 500 and 2000 Å; and a height in the range between about 0.1 and 0.8 μm.

Figure 11:
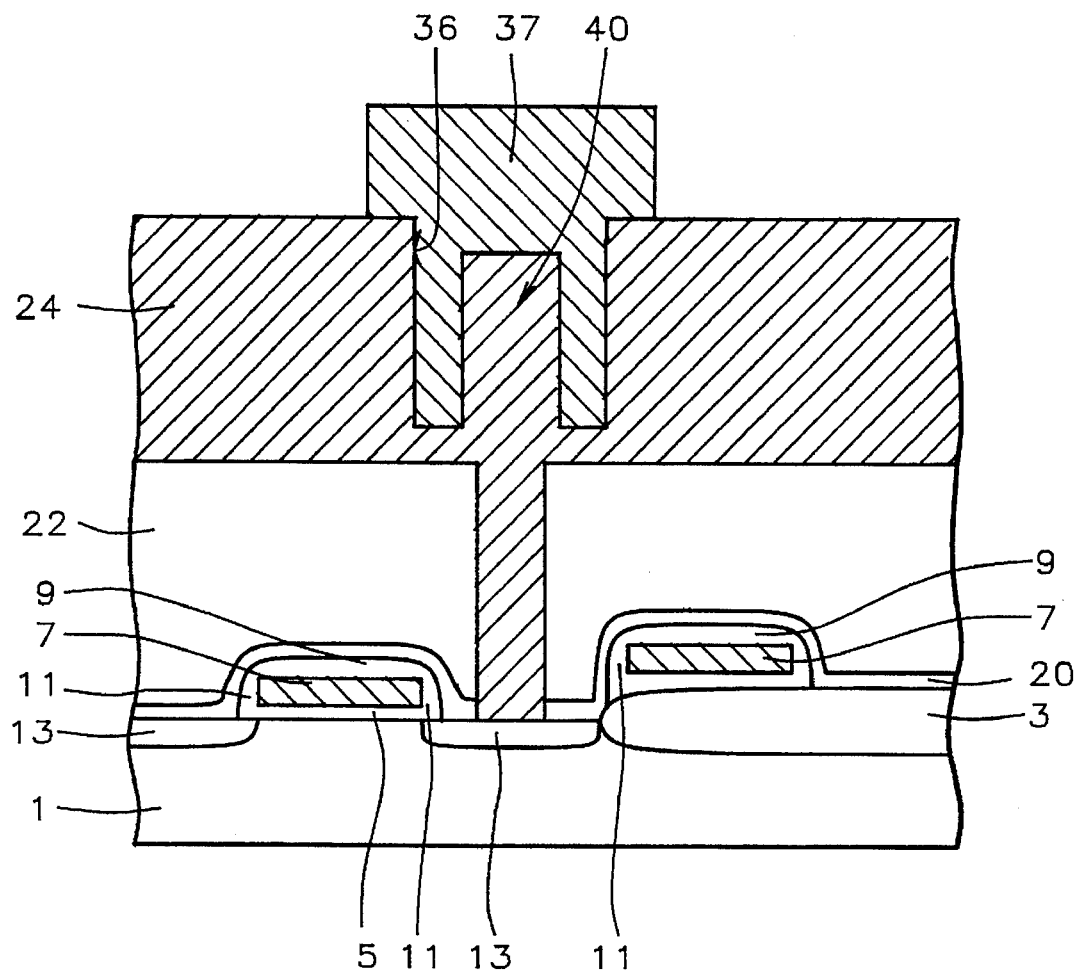

As shown in FIG. 11, the polyoxide masking layer 30 is then removed. Next, a photoresist layer 37 covering the channel 36, central spine 40 a portion (a width) of the first polysilicon layer 24 around the channel is formed. The photoresist layer has a first opening around the channel 36 and over first conductive layer which defines the annular ridge 42 around the central spine 40.

Figure 12:
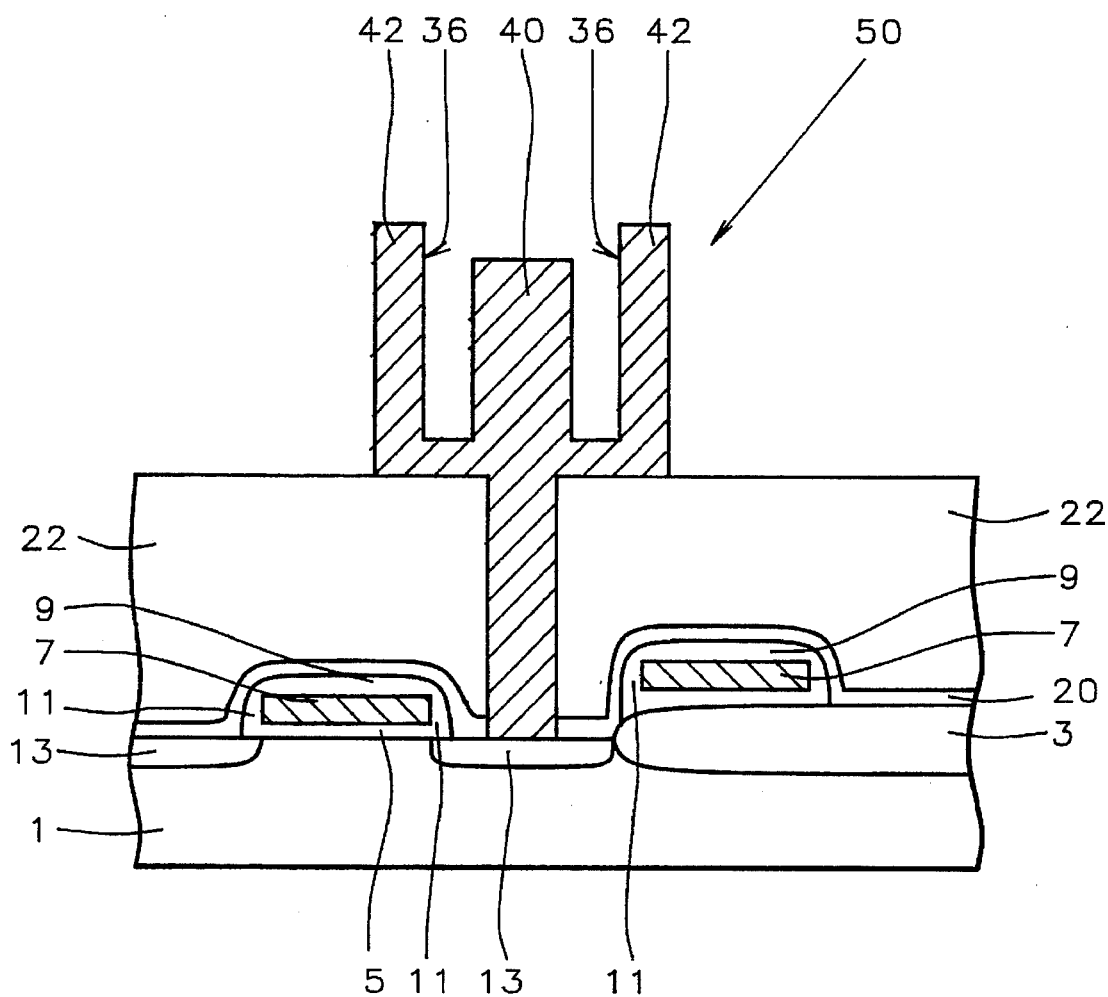

As shown in FIG. 12, the first conductive polysilicon layer 24 is etched using the photoresist layer 37 as a mask thereby forming the a storage electrode 30 comprised of the annual ridge 42 about the central spine 40. The ridge 42 preferably has a width in the range between about 0.1 and 0.3 μm; a height in the range between about 0.4 and 1.0 μm; and a spacing from the central spine in the range between about 0.05 and 0.2 μm.

Figure 13:
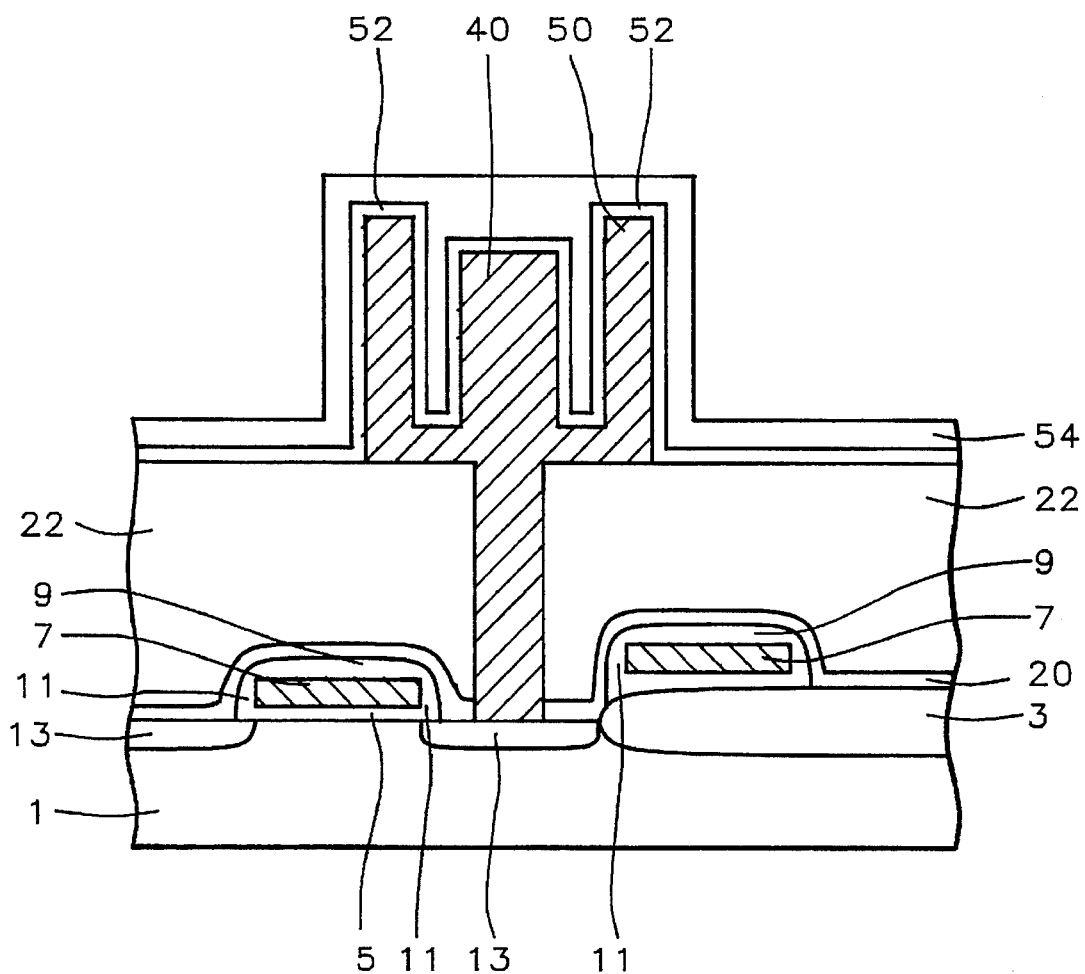

As displayed in FIG. 13, a capacitor dielectric layer 52 is formed over the storage electrode 50. The capacitor dielectric can be composed of a material selected from the group consisting of: silicon oxide/silicon nitride/silicon oxide (ONO), silicon nitride of $Ta_2O_5$ and has a thickness in the range between about 10 and 100 Å.

As shown in FIG. 13, a top plate electrode 54 is formed over the capacitor dielectric layer 52 thereby forming the coaxial capacitor. The top plates of adjacent capacitors electrically connected by the top plate electrode. The top plate electrode 54 is preferably formed of a conductive material doped polysilicon. The top plate electrode preferably has a thickness in the range between about 500 and 2000 Å and more preferably a thickness of about 1000 Å. The top plate electrode can have an impurity concentration in the range of between about 1E20 and 1E22 atoms/cm$^3$ and more preferably about 1E21 atoms/cm$^3$.

Figure 14:
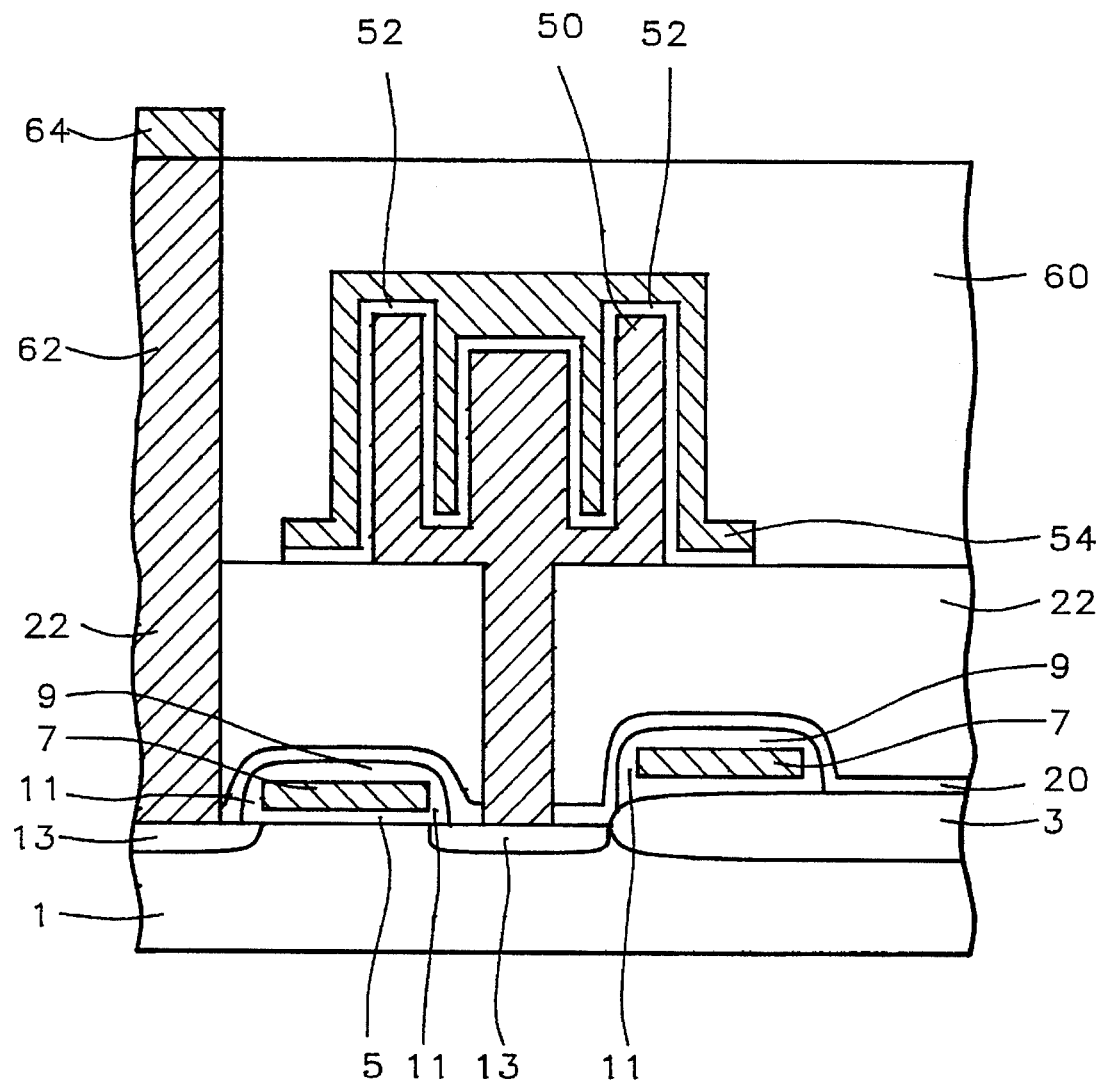

Now referring to FIG. 14, a cross sectional view of a single completed DRAM cell of an array of cells is shown. A top capping insulating layer 60 is formed over the top plate 54. The top insulating layer can have a thickness in the range of between about 3000 and 8000 Å. The top insulation layer 60 is preferably formed of borophosphosilicate glass (BPSG) or other silicon oxide materials. Next, a bit line contact 62 is formed to the drain 13 in the substrate. Also, other wiring 64 and passivation layers are formed overlying the top capping insulation layer 60 is formed to complete wiring the memory cells.

According to the present invention, a storage electrode of a capacitor can be obtained from a single conductive layer.

This makes the electrode stronger and more stable. The ability to form a coaxial capacitor using sidewall spacers to define the outer ridge electrode improves the layout precision thus allowing a more compact capacitor while maximizing the capacitance of the electrode. The additional process tolerance allowed the spacer etch process also increases process yields. The process of the invention of forming grooves and sidewall spacers provides a simple and inexpensive method of reliable, high capacitance capacitors.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a high capacitance coaxial capacitor on a semiconductor substrate having a device area formed thereon comprising the steps of:

forming a first insulation layer over said device area and elsewhere over the substrate surface;

forming a contact opening in said first insulation layer to expose said device area;

forming a first conductive layer on said first insulation layer and in said contact opening;

forming an annular groove in said first conductive layer centered over said contact opening; said annular groove having sidewalls;

forming sidewall spacers on said sidewalls of said annular groove;

forming a masking layer covering said first conductive layer;

removing said sidewall spacers exposing portions of said first conductive layer;

etching said exposed portions of said first conductive layer using said masking layer as a mask forming a channel surrounding a central spine;

removing said masking layer;

masking and etching said first conductive layer forming a patterned area of said first conductive layer over and aligned to said device area thereby forming an annular ridge about said central spine; said central spine and said annular ridge comprising a storage electrode;

sequentially forming a capacitor dielectric layer and a second conductive layer over said storage electrode; and patterning said capacitor dielectric layer and said second conductive layer to form a capacitor dielectric and top electrode, over and adjacent to said storage electrode thereby forming said coaxial capacitor.

2. The method of claim 1 wherein said first insulation layer is composed of a material selected from the group consisting of: silicon oxide and borophosphosilicate glass and has a thickness in the range between about 5000 and 10,000 Å.

3. The method of claim 1 wherein said first conductive layer is formed of doped polysilicon having an impurity concentration in the range between about 1E20 and 1E21 atoms/cm$^3$ and has a thickness in the range between about 3000 and 8000 Å.

4. The method of claim 1 wherein said sidewall spacers are composed silicon nitride, and said sidewall spacers have a width in the range between about 1000 and 2000 Å.

5. The method of claim 1 wherein said sidewall spacers are formed by depositing an insulation layer composed of silicon nitride over said first conductive layer and anisotropically etching said insulation layer and exposing the surface of said first conductive layer.

6. The method of claim 1 wherein said masking layer is formed by oxidizing said first conductive layer forming a polyoxide layer and said polyoxide layer has a thickness in the range between about 300 and 1000 Å.

7. The method of claim 1 wherein said annular groove has a width in the range between about 0.4 and 1.2 µm and a depth in the range between about 0.1 and 0.2 µm.

8. The method of claim 1 wherein said etching said exposed portions of said first conductive layer is performed with a reactive ion etch.

9. The method of claim 1 wherein said central spine has a diameter in the range between about 500 and 2000 Å and a height in the range between about 0.2 and 0.8 µm.

10. The method of claim 1 wherein said annular ridge has a width in the range between about 0.1 and 0.3 µm; a height in the range between about 0.4 and 1.0 µm; and a spacing from said central spine in the range between about 0.5 and 0.2 µm.

11. The method of claim 1 wherein said capacitor dielectric is composed of a material selected from the group consisting of: silicon oxide/silicon nitride/silicon oxide (ONO), silicon nitride and Ta$_2$O$_5$; and has a thickness in the range between about 10 and 100 Å.

12. The method of claim 1 wherein said top plate electrode is formed of doped polysilicon having a thickness in the range between about 1000 and 2000 Å and an impurity concentration in the range between about 1E20 and 1E22 atoms/cm$^3$.

13. The method of claim 1 wherein said first conductive layer in said contact opening contacts a source region of a field effect transistor in said device area thereby forming a dynamic random access memory cell.

14. The method of claim 1 wherein said annular groove and ridge have a shape selected from the group consisting of: square, rectangular, and circular.

15. A method of fabricating a high capacitance coaxial capacitor on a semiconductor substrate having a device area formed thereon comprising the steps of:

forming a conformal dielectric layer composed of silicon oxide over said device area and elsewhere over the substrate surface;

forming a first insulation layer composed of borophosphosilicate glass over said conformal dielectric layer;

forming a contact opening in said first insulation layer to expose said device area;

forming a first conductive layer composed of polysilicon on said first insulation layer and in said contact hole;

forming an annular groove in said first conductive layer centered over said contact opening; said annular groove having sidewalls;

forming sidewall spacers composed of silicon nitride on said sidewalls of said annular groove;

forming a masking layer composed of polyoxide covering said first conductive layer;

removing said sidewall spacers exposing portions of said first conductive layer;

etching said exposed portions of said first conductive layer using said masking layer as a mask forming a channel surrounding a central spine in said first conductive layer;

removing said masking layer;

forming a photoresist layer having a first opening over said first conductive layer defining an annular ridge around said central spine;

etching said first conductive layer using said photoresist layer as a mask thereby forming an annual ridge about said central spine; said central spine and said annular ridge comprising a storage electrode;

sequentially forming a capacitor dielectric layer and a second conductive layer over said storage electrode; and patterning said capacitor dielectric layer and said second conductive layer to form a capacitor dielectric and top electrode, over and adjacent to said storage electrode; thereby forming said coaxial capacitor.

16. The method of claim 15 wherein said first insulation layer has a thickness in the range between about 5000 and 10,000 Å.

17. The method of claim 15 wherein said first conductive layer is formed of doped polysilicon having an impurity concentration in the range between about 1E20 and 1E21 atoms/cm$^3$ and has a thickness in the range between about 3000 and 8000 Å.

18. The method of claim 15 wherein said sidewall spacers are composed silicon nitride, and said sidewall spacers have a width in the range between about 1000 and 2000 Å.

19. The method of claim 15 wherein said masking layer is formed by oxidizing said first conductive layer forming a polyoxide layer and said polyoxide layer has a thickness in the range between about 300 and 1000 Å.

20. The method of claim 15 wherein said annular groove has a width in the range between about 0.4 and 1.2 µm and a depth in the range between about 0.1 and 0.2 µm.

21. The method of claim 15 wherein said central spine has a diameter in the range between about 500 and 2000 Å and a height in the range between about 0.2 and 0.8 µm.

22. The method of claim 15 wherein said annular ridge has a width in the range between about 0.1 and 0.3 µm; a height in the range between about 0.4 and 1.0 µm; and a spacing from the central spine in the range between about 0.5 and 0.2 µm.

23. The method of claim 15 wherein said first conductive layer in said contact opening contacts a source region of a field effect transistor in said device area thereby forming a dynamic random access memory cell.

24. A method of fabricating a dynamic random access memory device having a coaxial capacitor in device areas for a memory cell unit; said memory device having a source, a drain, and a transfer gate on a substrate; which comprises the steps of:

forming a metal oxide semiconductor device having source and drain regions, adjacent to a field oxide region, in a silicon substrate;

forming a conductive word line over said field oxide region;

forming a first insulation layer over said MOS device, said conductive word line and field oxide region;

forming a contact opening in said first insulation layer exposing said source region;

forming a first conductive layer on said first insulation layer and in said contact opening;

forming an annular groove in said first conductive layer centered over said contact opening; said annular groove having sidewalls;

forming sidewall spacers on said sidewalls of said annular groove;

forming a masking layer covering said first conductive layer;

removing said sidewall spacers exposing portions of said first conductive layer;

etching said exposed portions of said first conductive layer using said masking layer as a mask forming a channel surrounding a central spine;

removing said masking layer;

masking and etching said first conductive layer forming a patterned area of said first conductive layer over and aligned to said device area thereby forming an annual ridge about said central spine; said central spine and said annular ridge comprising a storage electrode;

sequentially forming a capacitor dielectric layer and a second conductive layer over said storage electrode; and patterning said capacitor dielectric layer and said second conductive layer to form a capacitor dielectric and top electrode, over and adjacent to said storage electrode;

forming a bit line contact opening through said top insulation layer to said drain region; and forming a second conductive layer in said bit line contact opening thereby forming said dynamic random access memory device having a coaxial capacitor.

25. The method of claim 24 wherein said first conductive layer is formed of doped polysilicon having an impurity concentration in the range between about 1E20 and 1E21 atoms/cm$^3$ and has a thickness in the range between about 3000 and 8000 Å.

26. The method of claim 24 wherein said sidewall spacers are composed silicon nitride, and said sidewall spacers have a width in the range between about 1000 and 2000 Å.

27. The method of claim 24 wherein said masking layer is formed by oxidizing said first conductive layer forming a polyoxide layer and said polyoxide layer has a thickness in the range between about 300 and 1000 Å.

28. The method of claim 24 wherein said annular groove has a width in the range between about 0.4 and 1.2 µm and a depth in the range between about 0.1 and 0.2 µm.

29. The method of claim 24 wherein said central spine has a diameter in the range between about 500 and 2000 Å and a height in the range between about 0.2 and 0.8 µm.

30. The method of claim 24 wherein said annular ridge has a width in the range between about 0.1 and 0.3 µm; a height in the range between about 0.4 and 1.0 µm; and a spacing from the central spine in the range between about 0.5 and 0.2 µm.

* * * * *